(12) United States Patent
Meir

(10) Patent No.: US 7,180,775 B2
(45) Date of Patent: Feb. 20, 2007

(54) DIFFERENT NUMBERS OF BITS PER CELL IN NON-VOLATILE MEMORY DEVICES

(75) Inventor: Avraham Meir, Rishon Lezion (IL)

(73) Assignee: msystems Ltd., Kfar Saba (IL)

( * ) Notice: Subject to any disclaimer, the term of this patent is extended or adjusted under 35 U.S.C. 154(b) by 205 days.

(21) Appl. No.: 11/037,153

(22) Filed: Jan. 19, 2005

(65) Prior Publication Data

US 2006/0028877 A1    Feb. 9, 2006

Related U.S. Application Data

(60) Provisional application No. 60/598,773, filed on Aug. 5, 2004.

(51) Int. Cl.
*G11C 11/34* (2006.01)

(52) U.S. Cl. ............... 365/185.03; 365/185.17

(58) Field of Classification Search ........... 365/185.03, 365/185.17
See application file for complete search history.

(56) References Cited

U.S. PATENT DOCUMENTS

| | | | |
|---|---|---|---|
| 5,930,167 A | 7/1999 | Lee et al. | |
| 6,331,951 B1 * | 12/2001 | Bautista et al. | 365/185.22 |
| 6,456,528 B1 | 9/2002 | Chen | |
| 6,493,266 B1 * | 12/2002 | Yachareni et al. | 365/185.22 |
| 6,717,847 B2 | 4/2004 | Chen | |
| 6,807,106 B2 | 10/2004 | Gonzales et al. | |

* cited by examiner

*Primary Examiner*—Tuan T. Nguyen
(74) *Attorney, Agent, or Firm*—Mark M. Friedman

(57) ABSTRACT

A method of manufacturing a non-volatile flash memory device, including setting a first number of bits stored per cell for at least one first cell less than a second number of bits stored per cell for at least one second cell such that the setting permanently fixes the first number and the second number prior to shipping the device for use. Preferably the setting is based on predicted reliabilities of the cells. Preferably, the predicted reliability of the first cells is less than the predicted reliability of the second cells. Preferably, the setting is based on respective locations within the device of the first cells and the second cells. Preferably, the setting is based on respective word lines connecting to the first cells and the second cells.

15 Claims, 3 Drawing Sheets

DIFFERENT NUMBERS OF BITS PER CELL IN NON-VOLATILE MEMORY DEVICES

CROSS REFERENCE TO RELATED APPLICATIONS

This application claims the benefit from U.S. provisional application 60/598,773 filed 5 Aug. 2004 by the present inventor.

FIELD AND BACKGROUND OF THE INVENTION

The present invention relates to non-volatile flash memory devices and, more particularly, to a flash memory device of greater storage capacity compared with prior art flash memory devices. Specifically, the device includes a different number of bits per cell dependent on the predicted reliability of the cell.

Flash memory is a type of non-volatile memory. Non-volatile memory stores information on a silicon chip in a way that does not need power to maintain the information in the chip. If power to the chip is turned off, the information is retained without consuming any power. Flash memory is made in different forms including NOR flash and NAND flash. The names refer to the similarity of the interconnections between storage cells in the two types of flash memory to the well-known NOR and NAND logic circuits. A limitation of flash memory is that while flash memory can be read or programmed, for instance in NOR flash a byte or word at a time in a random access fashion, a block of memory must be erased at the same time. A block is the smallest chunk of memory that is erased in one operation. In NAND flash memory, the memory can be read or programmed in a random access fashion a page at a time. A block is typically much larger than a page in NAND flash.

Flash memory is based on the floating-gate metal oxide transistor which is essentially an NMOS transistor with an additional conductor suspended between the gate and source/drain terminals. Flash memory stores information in an array of transistors, called "cells". Each cell is similar to a standard MOSFET transistor, but the cell has two gates instead of just one. One gate is the control gate (CG) like in other MOS transistors, and the second gate is a floating gate (FG) that is insulated by an oxide layer. The FG is between the CG and the substrate. Because the FG is isolated by the insulating oxide layer, any electrons placed on it get trapped there. Electrons on the FG modify, i.e. partially cancel out the electric field coming from the CG. The cell is "read" by applying a specific voltage on the CG. Electrical current either flows if the applied voltage is greater than a threshold voltage or otherwise electrical current does not flow, depending on the threshold voltage of the cell controlled by the number of electrons on the FG. The presence or absence of current is sensed and translated into 1's and 0's, reproducing the stored data.

Newer flash memory devices, sometimes referred to as multi-level cell devices (MLC), can store more than one bit per cell, by varying the number of electrons placed on the floating gate (FG) of a cell. In a multi-level cell device the amount of current is sensed, rather than simply the presence or absence of current. Two or more bits of data are stored in each cell by operating the individual cells with four or more programmable states. Three threshold breakpoint levels are necessary to define four different threshold states. Since an available operating range of the individual cells is divided into an increased number of states, the range of each state is smaller. In order to assure that the state of a cell programmed into a particular threshold range is accurately read, the programming is usually performed with an additional margin beyond the threshold breakpoint level. In MLC devices, because the separation between the storage states is smaller, storing more bits per cell reduces the reliability of any single bit. In most MLC devices the device manufacturer does not give the user any means to select the number of bits per cell in a given block, i.e the number of bits per cell is the same for all the cells in the device. In some cases the number of bits per cell can be reduced on parts of a device in order to achieve higher performance or higher reliability during programming. For example, a MLC flash may store two bits per cell in most of its blocks, but under software program control, store only one bit per cell in some blocks. MLC flash devices having different blocks within the same device storing different numbers of bits per cell have been disclosed in prior art. Representative prior art includes Lee et al. U.S. Pat. No. 5,930,167, Gonzales et al. U.S. Pat. No. 6,807,106, and Chen U.S. Pat. Nos. 6,456,528 and 6,717,847. Chen discloses switching blocks to a lower number of bits per cell when the blocks approach the end of their expected useful lifetime.

Reference is now made to FIG. 1 (prior art) a simplified drawing of a NAND flash memory device 10 including an array of cells 105. Cells 105 are accessed by word lines 103 connected to control gates of cells 105 and by bit lines 107 connected to array 10 at the drain side. Bit line 107 is selected by a bit line select (drain side) 109 and a bit line select (source side) 111. Typically, in some NAND flash devices, not all cells 105 have the same reliability. For example, cells that are closer to the bit line select (drain side) 109 are more sensitive to disturbance errors than other cells 105, while cells closer to the source side select 111 have better reliability characteristics. When designing a flash memory device the designer has to take into account that even the lower reliability cells 105 will be used for storing the maximal number of bits per cell the device specification allows, and therefore the characteristics of the poorest reliability cells dictate the number of bits per cell that the device will store in all cells 105. For instance, setting 4 bits per cell in all cells 105 for all word lines 105 would cause device 10 to fail its reliability specification due to the inferior reliability of certain cells 105.

There is thus a need for, and it would be highly advantageous to have a device of increased storage capacity that utilizes the highest number of bits that can be stored in each cell without compromising reliability of the device.

SUMMARY OF THE INVENTION

According to the present invention there is provided a method of manufacturing a non-volatile flash memory device, including setting a first number of bits stored per cell for at least one first cell less than a second number of bits stored per cell for at least one second cell such that the setting permanently fixes the first number and the second number prior to shipping the device for use. Preferably the setting is based on predicted reliabilities of the cells. Preferably, the predicted reliability of the first cells is less than the predicted reliability of the second cells. Preferably, the setting is based on respective locations within the device of the first cells and the second cells. Preferably, the setting is based on respective word lines connecting to the first cells and the second cells.

According to the present invention there is provided a non-volatile flash memory device wherein during manufacture of the device, a first number of bits stored per cell of at least one first cell is set less than a second number of bits stored per cell of at least one second cell such that the device includes a mechanism which permanently fixes the first number and the second number prior to shipping the device for use. Preferably, the first number and the second number are based on respective predicted reliabilities of the first cells and the second cells. Preferably, the predicted reliability of the first cells is less than the predicted reliability of the second cells. Preferably, the first number and the second number are based on respective locations within the device of the first cells and the second cells. Preferably, the first number and the second number are based on word lines connecting respectively to the first cells and the second cells.

According to the present invention there is provided a system for manufacturing a non-volatile flash memory device. The system includes the flash memory device with at least one first cell and at least one second cell and a mechanism for setting a first number of bits stored per cell of the first cells less than a second number of bits stored per cell of the second cells. The device further includes a mechanism which permanently fixes the first number and the second number prior to shipping the device for use. Preferably, the first number and the second number are based on respective predicted reliabilities of the first cells and the second cells. Preferably, the predicted reliability of the first cells is less than the predicted reliability of the second cells. Preferably, the first number and the second number are based on respective locations within the device of the first cells and the second cells. Preferably, the first number and the second number are based on word lines connecting respectively to the first cells and the second cells.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
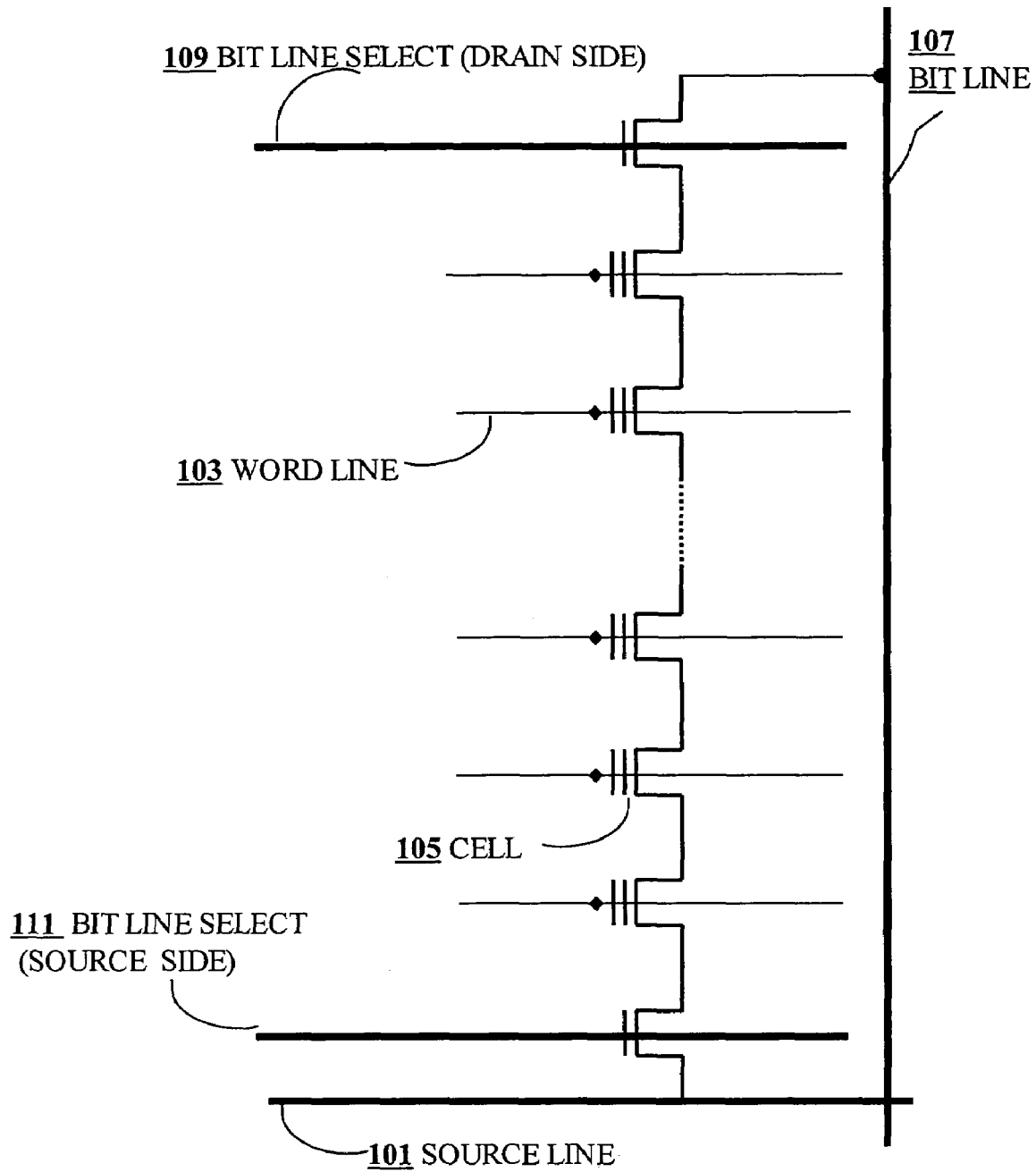
FIG. 1 (prior art) is a schematic drawing of a conventional NAND flash memory.

The present invention is of an improved flash memory device. Specifically, the device includes a different number of bits per cell dependent on the predicted reliability of the cell.

The principles and operation of an improved flash memory device and method according to the present invention, may be better understood with reference to the drawings and the accompanying description.

It should be noted, that although the discussion herein relates to NAND flash memory structures, the present invention may, by non-limiting example, alternatively be configured as well using NOR devices or other memory structures.

Before explaining embodiments of the invention in detail, it is to be understood that the invention is not limited in its application to the details of design and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

By way of introduction, the principal intention of the present invention is to provide a cost-effective flash memory device by increasing the number of bits per cell for cells of known higher reliability and decreasing the number of bits per cell for cells of lower reliability and thereby maximizing the storage capacity of the memory device. It should be understood that unlike the prior art that includes reconfiguring bits per cell during device use, the present invention sets the number of bits per cell for each cell during device manufacturing without allowing the user to reconfigure the number of bits per cell for any cell, and therefore guaranteeing the reliability of the device.

Figure 2:
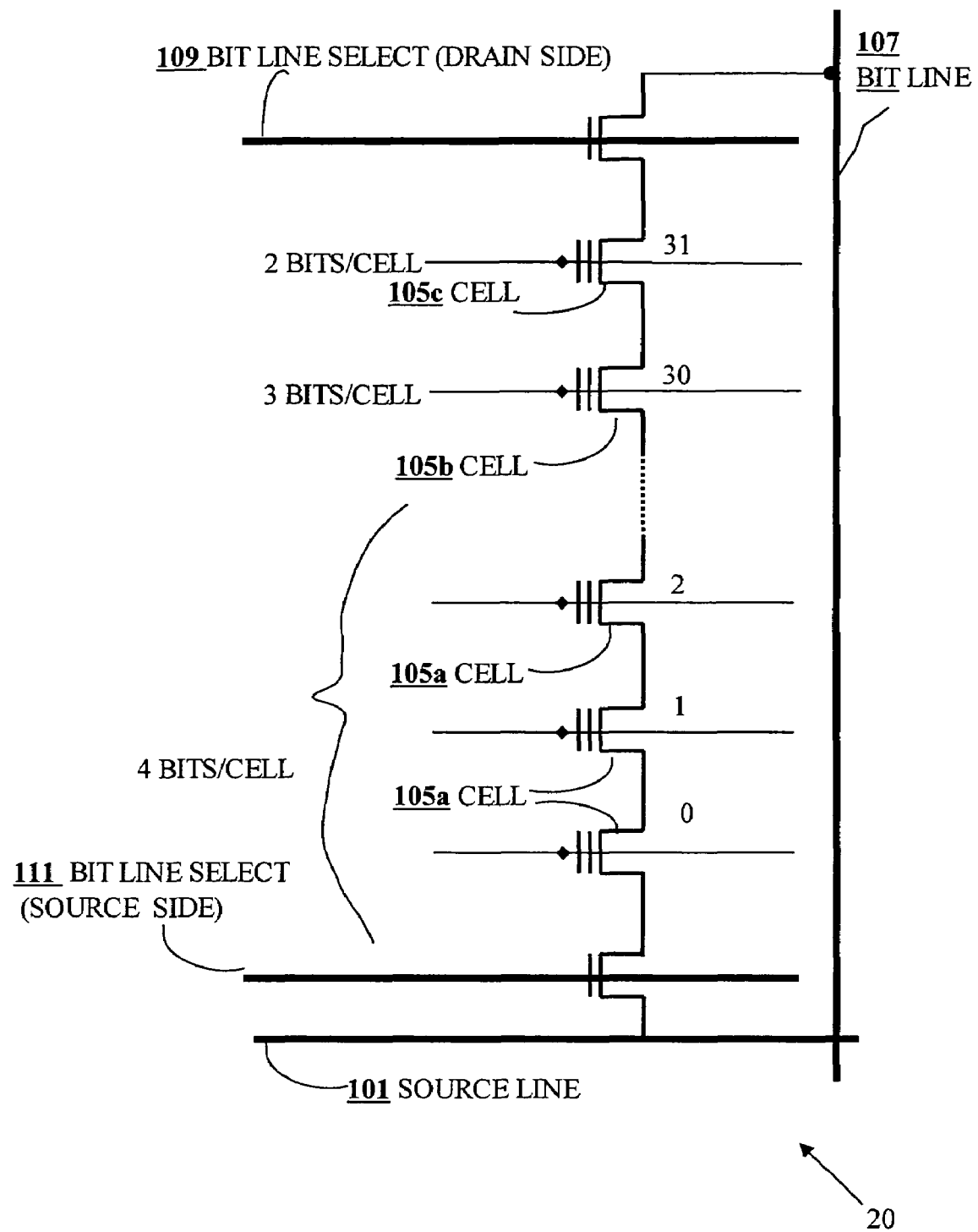
FIG. 2 is a drawing according to an embodiment of the present invention showing a NAND flash memory device of improved performance.

Referring now to the drawings, FIG. 2 illustrates a NAND flash device 20 in which the number of bits per cell stored in different cells is set according to the expected reliability of the cells, according to an embodiment of the present invention. NAND flash device 20 includes for instance 32 word lines 103 in a block. As stated above, it is known that lower word lines 103 close to source side 111 have less disturbance than upper word lines 103 closer to drain side 109. Thus, to maximize the storage capacity of device 20 without sacrificing reliability, 4 bits per cell are set in cells 105a connected to word lines 103 numbered 0–29, 3 bits per cell in cells 105b connected to word line 103 number 30, and 2 bits per cell in cells 105c, connected to word line 103 number 31. Comparing flash device 20 with prior art device 10 with 4 bits per cell in all cells, device 20 has nearly the same storage capacity as prior art device 10, however device 20 passes the reliability specification whereas prior art device 10 does not pass the reliability specification. Alternatively device 20 has nearly twice the storage capacity of prior art device 10 configured with 2 bits/cell in all cells 105, with both devices 10 and 20 passing the same reliability specification.

Figure 3:
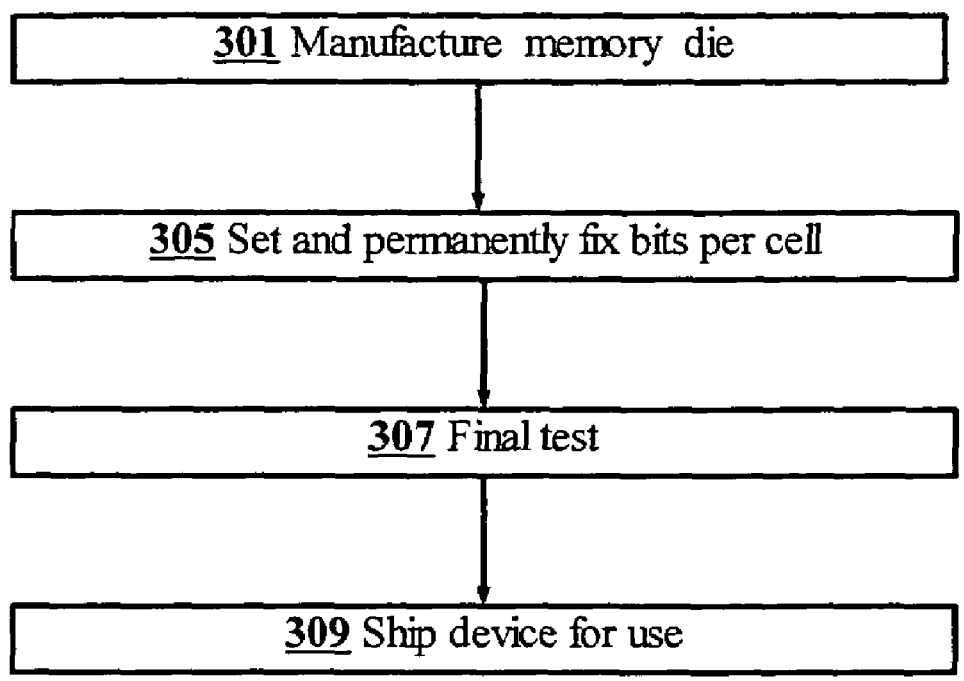
FIG. 3 is a simplified drawing of a production process, according to an embodiment of the present invention

Reference is now made to FIG. 3, a simplified flow diagram of a production process 30 of flash device 20 according to an embodiment of the present invention. Production process 30 typically includes manufacturing (step 301) a memory die which is typically packaged in a chip package. After manufacture (step 301), cells 105 of known lower reliability are set, i.e. permanently fixed (step 305), to a lower number of bits per cell than other cells 105 of higher reliability. Setting bits/cell (step 305) can be performed according to the physical location of cells 105 or according to other cell parameters that influence cell reliability. Flash device 20 subsequently undergoes a final test procedure (step 307) and is packed and shipped for use (step 309).

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

While the invention has been described with respect to a limited number of embodiments, it will be appreciated that many variations, modifications and other applications of the invention may be made.

What is claimed is:

1. A method of manufacturing a non-volatile flash memory device, the method comprising the step of:
   (a) setting a first number of bits stored per cell for at least one first cell less than a second number of bits stored per cell for at least one second cell;
   wherein said setting permanently fixes said first number and said second number prior to shipping the device for use.

2. The method, according to claim 1, wherein said setting is based on respective predicted reliabilities of said at least one first cell and said at least one second cell.

3. The method, according to claim 2, wherein said predicted reliability of said at least one first cell is less than said predicted reliability of said at least one second cell.

4. The method, according to claim 1, wherein said setting is based on respective locations within the device of said at least one first cell and said at least one second cell.

5. The method, according to claim 1, wherein said setting is based on respective word lines connecting to said at least one first cell and said at least one second cell.

6. A non-volatile flash memory device, having a first number of bits stored per cell for at least one first cell and having a second number of bits stored per cell for at least one second cell, wherein said first number is less than said second number;
   wherein said first number and said second number are permanently fixed prior to shipping the device for use.

7. The device, according to claim 6, wherein said first number and said second are based on respective predicted reliabilities of said at least one first cell and said at least one second cell.

8. The device, according to claim 7, wherein said predicted reliability of said at least one first cell is less than said predicted reliability of said at least one second cell.

9. The device, according to claim 6, wherein said first number and said second number are based on respective locations within the device of said at least one first cell and said at least one second cell.

10. The device, according to claim 6, wherein said first number and said second number are based on word lines connecting respectively to said at least one first cell and said at least one second cell.

11. A system for manufacturing a non-volatile flash memory device, the system comprising:
    (a) the flash memory device including at least one first cell and at least one second cell;
    wherein a first number of bits stored per cell of said at least one first cell is set less than a second number of bits stored per cell of said at least one second cell;
    wherein said first number and said second number are permanently fixed prior to shipping the device for use.

12. The system, according to claim 11, wherein said first number and said second are based on respective predicted reliabilities of said at least one first cell and said at least one second cell.

13. The system, according to claim 12, wherein said predicted reliability of said at least one first cell is less than said predicted reliability of said at least one second cell.

14. The system, according to claim 11, wherein said first number and said second number are based on respective locations within the device of said at least one first cell and said at least one second cell.

15. The system, according to claim 11, wherein said first number and said second number are based on word lines connecting respectively to said at least one first cell and said at least one second cell.

* * * * *